(12) United States Patent
Nakamura et al.

(10) Patent No.: US 7,851,996 B2
(45) Date of Patent: Dec. 14, 2010

(54) DISPLAY APPARATUS

(75) Inventors: Kohichi Nakamura, Kawasaki (JP);
Somei Kawasaki, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 781 days.

(21) Appl. No.: 11/559,612

(22) Filed: Nov. 14, 2006

(65) Prior Publication Data

US 2007/0120473 A1 May 31, 2007

(30) Foreign Application Priority Data

Nov. 16, 2005 (JP) .............................. 2005-331602

(51) Int. Cl.
*H01J 1/62* (2006.01)
*H01J 63/04* (2006.01)

(52) U.S. Cl. ........................ 313/506; 313/504; 313/505; 313/509

(58) Field of Classification Search .......... 313/495–512
See application file for complete search history.

(56) References Cited

U.S. PATENT DOCUMENTS

| | | | |
|---|---|---|---|
| 6,690,110 B1 | 2/2004 | Yamada et al. | |
| 6,894,431 B2 | 5/2005 | Yamazaki et al. | 313/498 |
| 2001/0015618 A1 | 8/2001 | Yamazaki et al. | 313/505 |
| 2003/0168966 A1* | 9/2003 | Kobayashi et al. | 313/495 |
| 2005/0023956 A1* | 2/2005 | Kwak et al. | 313/495 |
| 2005/0156509 A1 | 7/2005 | Yamazaki et al. | 313/498 |
| 2006/0061268 A1* | 3/2006 | Nakanishi | 313/506 |
| 2006/0250080 A1 | 11/2006 | Yamazaki et al. | 313/506 |

(Continued)

FOREIGN PATENT DOCUMENTS

CN 1662107 8/2005

(Continued)

OTHER PUBLICATIONS

Chinese Office Action issued in Chinese Application No. 200610149390.4 dated Dec. 26, 2008, and an English-language translation thereof.

(Continued)

*Primary Examiner*—Nimeshkumar D Patel
*Assistant Examiner*—Thomas A Hollweg
(74) *Attorney, Agent, or Firm*—Fitzpatrick, Cella, Harper & Scinto

(57) ABSTRACT

In order to suppress potential fluctuation by increases in wiring resistance and necessary current amount caused by increases in the size and resolution of a display area, a display area in which a plurality of EL devices and a plurality of pixel circuits are disposed on a substrate is formed. Each EL device is disposed between a lower pixel electrode and an upper transparent electrode on the substrate. The pixel electrode is electrically connected to a power supply line through the pixel circuit, and the transparent electrode is electrically connected to a common voltage line through a contact hole. The power supply line and the common voltage line are disposed parallel to each other at a periphery of the display area, and the power supply line is divided into two lines disposed on both sides of the contact hole. Alternatively, the power supply line is disposed on one side of the contact hole, and the common voltage line is disposed on the other side of the contact hole with a width larger than that of the contact hole.

1 Claim, 7 Drawing Sheets

U.S. PATENT DOCUMENTS

| | | | |
|---|---|---|---|
| 2007/0096633 A1* | 5/2007 | Lee et al. | 313/500 |
| 2007/0120779 A1 | 5/2007 | Nakamura et al. | 345/76 |
| 2007/0146245 A1 | 6/2007 | Goden et al. | 345/76 |
| 2007/0146246 A1 | 6/2007 | Nakamura et al. | 345/76 |

FOREIGN PATENT DOCUMENTS

| | | |
|---|---|---|
| JP | 2005-158292 | 6/2005 |
| JP | 2006-066206 | 3/2006 |

OTHER PUBLICATIONS

Chinese Office Action issued in Chinese Application No. 200910168191.1 dated Aug. 11, 2010, and an English-language translation thereof.

* cited by examiner

DISPLAY APPARATUS

FIELD OF THE INVENTION AND RELATED ART

The present invention relates to a display apparatus, specifically a display apparatus having a display area in which a plurality of unit pixels each provided with a current drive-type light-emitting device and a pixel circuit (or drive circuit) for controlling a drive current for the light-emitting device, which are disposed on a substrate. Particularly, the display apparatus of the present invention is suitably used as such a display apparatus that electroluminescent (EL) devices for emitting light by passing current therethrough.

In recent years, display apparatuses using EL devices have attracted notice as display apparatuses that can be used in place of a cathode ray tube (CRT) or a liquid crystal device (LCD). Of these display apparatuses, applications, and developments, organic EL devices, functioning as current-drive-type light-emitting devices in which luminance is controlled by a current passing through the devices, have been actively effected.

For example, a display apparatus has been studied that has a display area constituted by arranging a plurality of pixels each including an organic EL device and a thin film transistor (TFT) as a control device for controlling a current to be passed through the organic EL device. Further, in an organic EL device including a peripheral circuit, the TFT is used in not only the display apparatus but also in the peripheral circuit.

In recent years, in such display apparatuses, increases in size of a display area, resolution, the number and length of interconnecting lines such as signal lines and scanning lines, have occurred, so that the wiring lengths of power supply lines and common voltage lines for supplying a current to each pixel in the display area have also been increased.

The increased wiring length leads to an increase in wiring resistance. Further, due to increases in screen size and resolution of the display apparatus, the amount of current passing through the display apparatus is also increased. With the increases in wiring resistance and the current amount, the display apparatus is largely affected by a potential (voltage) drop along the wiring. As a result, there is a problem such that a constant power potential cannot be supplied to the entire display area, thereby causing a deterioration in display quality.

In order to solve the problem, U.S. Pat. No. 6,690,110 discloses a method of suppressing the potential drop by increasing the width of a power interconnecting line connecting an external (connection) terminal and a display area to decrease the wiring resistance and by forming a wide contact hole to lower the contact resistance of the power interconnecting line with a pixel electrode. However, when the power interconnecting line width and the contact hole size are increased, the area of the periphery of the display area, i.e., the frame area (size) is increased. Depending on the product to which the organic EL device is applied, the frame area is required to be as small as possible, so that there is a limit to the increase in wiring line width and contact hole size.

When moisture (water content) enters the organic EL device of the organic EL apparatus, a non-luminescent area (dark area) can be formed and deterioration in luminance can occur. Thus, a sealing technique for suppressing the entry of moisture into the device is essential. Japanese Laid-Open Patent Application (JP-A) 2005-158292 discloses such a technique in which a pixel area is surrounded two-dimensionally by a moisture-blocking structure formed of an inorganic material to block the entry of moisture.

In order to protect the EL device from external air containing moisture, the entire display portion (area) has been covered with a protection (passivation) film which is not permeable to moisture. In order to completely suppress the permeation (ingress) of moisture, it is necessary to provide the protection film with a thickness of a certain value or more. As a result, it is possible to block the moisture permeation in the thickness direction of the display area. But moisture permeation also occurs in a planar direction in such a manner that moisture enters the organic EL device principally through a moisture-absorptive film of the films constituting the display apparatus. Particularly, a flattening film is formed, as a lower layer of the organic EL device, of an organic compound such as acrylic resin, thus being liable to permit moisture permeation.

JP-A 2006-066206 discloses a method in which a contact hole for connecting a power interconnecting line and an electrode of a display device is provided in a peripheral area so as to separate a flattening film in a display area from that in an area outside the display area. Moisture which has entered the flattening film in the area outside the display area is blocked at the contact hole portion, so that the moisture cannot enter the inner flattening film. As a result, it is possible to suppress the moisture permeation in a horizontal direction of the display area. For this reason, by surrounding the display area with the contact hole, it is possible to almost always block the moisture permeation into the display area in a lateral direction.

When means for suppressing the moisture permeation or entrance is provided at the contact hole portion without being limited to the method in which the flattening film is separated by the contact hole, the protection film is required to have a thickness sufficient to block the moisture permeation in the vertical direction similarly as in the case of the display area, up to a portion at least on the contact hole.

The protection film is ordinarily formed by printing or film formation with a mask, so that the thickness thereof is gradually decreased in a certain range toward an end portion. For this reason, in order to ensure a predetermined thickness of the protection film on the contact hole, it is necessary to ensure a predetermined distance, for gradually decreasing the protection film thickness, from the outside of the contact hole to an end of a substrate or an inner edge of an adhesion area of a sealing cap.

On the other hand, the organic EL layer is also formed by film formation with a mask, so that the position thereof can be shifted. In order to absorb this shift so that the organic EL layer does not contact the contact hole, it is also necessary to ensure a certain distance between an outer side of the display area and an inner edge of the contact hole.

As described above, the contact hole is required to be disposed so as to ensure a certain distance between it and the substrate edge and the outer side of the display area. This constraint is also an obstacle to a reduction in size of the frame portion.

SUMMARY OF THE INVENTION

An object of the present invention is to suppress a fluctuation in power potential caused due to an increase in wiring length resulting from a large display area, an increase in the resultant wiring resistance, and an increase in the amount of current necessary to realize high definition (resolution), without increasing the frame area.

A specific object of the present invention is to provide a display apparatus capable of suppressing such a fluctuation in power potential.

According to an aspect of the present invention, there is provided a display apparatus, comprising: a substrate; a plurality of light-emitting devices, the light-emitting devices each comprising a first electrode disposed on an insulating layer, a second electrode, and a luminescent layer disposed between the first electrode and the second electrode; a plurality of drive circuits for controlling current passing through the light-emitting devices, the drive circuits being disposed under the insulating layer, and the light-emitting devices and the drive circuits being arranged in a row direction and a column direction; a first interconnecting line connected to the first electrode through the drive circuit; and a second interconnecting line connected to the second electrode through a contact hole provided in the insulating layer, the second interconnecting lines and the contact hole being disposed so as to surround an area in which the light-emitting device and the drive circuit are arranged. Along a side of the substrate, the first interconnecting line is disposed on both sides of the contact hole, or the first interconnecting line is disposed on one side of the contact hole and the second interconnecting line is extended to the other side of the contact hole.

According to another aspect of the present invention, there is provided a current drive-type display apparatus, comprising: a display area in which a plurality of current drive-type light-emitting devices and a plurality of pixel circuits for controlling a drive current for the current drive-type light-emitting devices are disposed on a substrate; and a peripheral area, on the substrate, in which first and second interconnecting lines supply current to the pixel circuits. Each of the current drive-type light-emitting devices is disposed between a lower first electrode and an upper second electrode. Each pixel circuit is connected to the first interconnecting line and supplies the drive current to an associated current drive-type light-emitting device through the first electrode. The second electrode is connected, through a contact hole provided in the peripheral area, to the second interconnecting line, which is a lower layer that is lower than the second electrode. In a plane of the substrate, the first interconnecting line is disposed on both sides of and along the second interconnecting line.

According to a further aspect of the present invention, there is provided a current drive-type display apparatus, comprising: a display area in which a plurality of current drive-type light-emitting devices and a plurality of device control circuits for controlling a drive current for the current drive-type light-emitting devices are disposed on a substrate. Each of the current drive-type light-emitting devices is disposed between a lower first electrode and an upper second electrode. Each device control circuit is connected to a first interconnecting line and supplies the drive current to an associated current drive-type light-emitting device through the first electrode. The second electrode is connected, through a contact hole provided at a periphery of the display area, to a second interconnecting line which is a lower layer that is lower than the second electrode. In a plane of the substrate, the first interconnecting line is disposed one side of and along the second interconnecting line, and the second interconnecting line is extended from a portion thereof contacting the second electrode through the contact hole to the other side where the first interconnecting line is not disposed.

According to the display apparatus of the present invention, it is possible to decrease the potential fluctuation of power lines connected to an area including a plurality of constitutional elements each provided with a current drive-type light-emitting device and a device control circuit for supplying a current to the light-emitting device, without increasing the frame area of the display apparatus. As a result, it is possible to provide a display apparatus capable of preventing the deterioration in display quality even when the size and resolution of the display area increases.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

An organic EL device is a current drive-type light-emitting device, i.e., a luminescent device for producing luminescence at a luminance depending on the current passing through the device. The present invention is suitably applicable to an active matrix-type display apparatus using the organic EL device. Hereinbelow, a structure of the organic EL device common to several embodiments of the present invention will be described.

Figure 1:
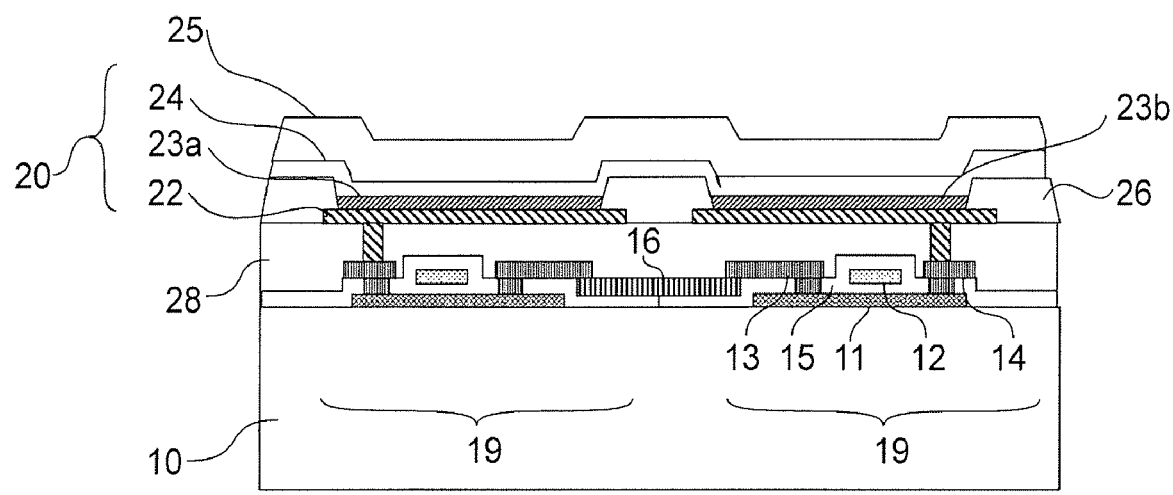
FIG. 1 is a schematic sectional view showing a constitution of an organic EL device.
Figure 2:
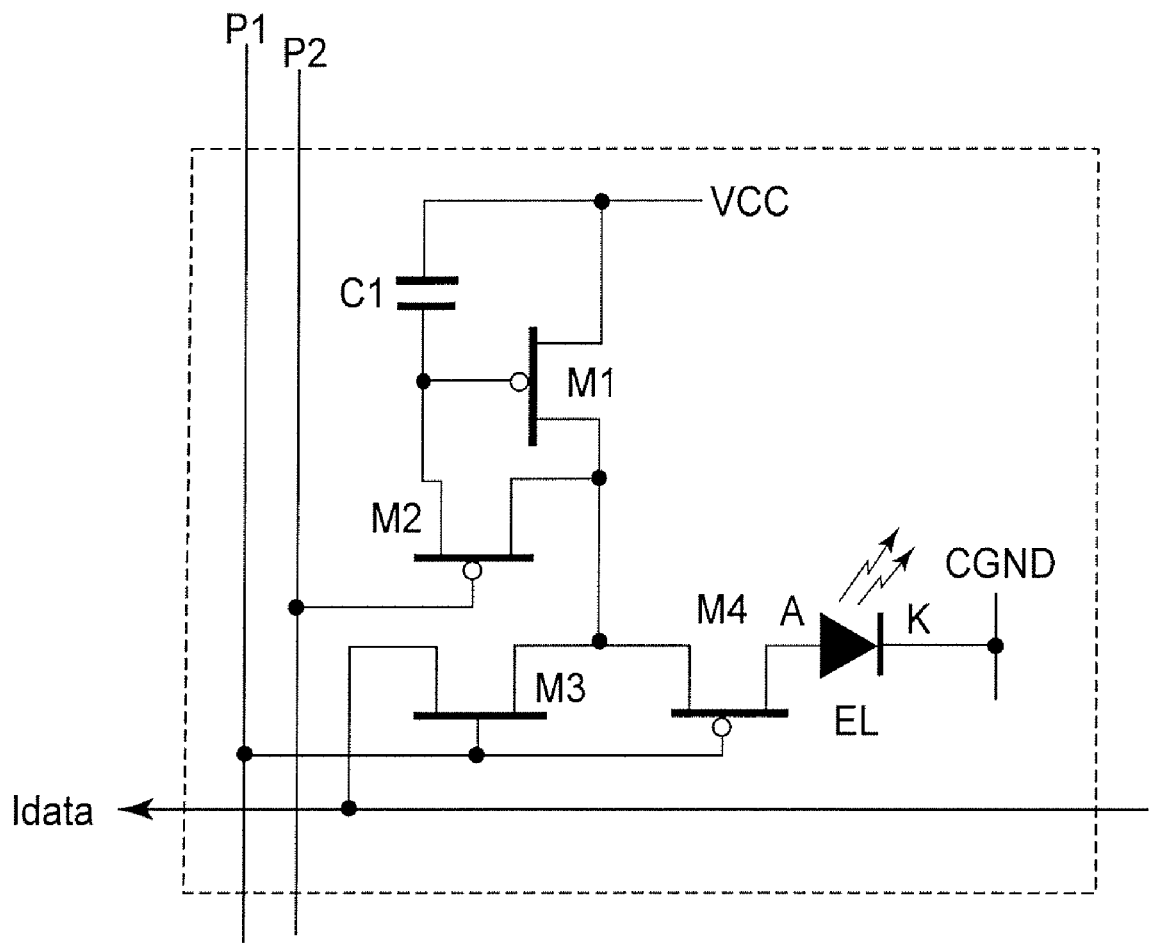
FIG. 2 is a circuit diagram showing a pixel circuit of the organic EL device.

FIG. 1 is a schematic sectional view showing an organic EL device 20 constituted on a substrate 10 and a drive circuit (pixel circuit) 19 for the organic EL device 20, and FIG. 2 is an equivalent circuit of the organic EL device.

The organic EL device 20 includes a first electrode 22 as a lower layer, a second electrode 24 as an upper layer, and several layers 23 (23a and 23b) of organic compound disposed between the first and second electrodes 22 and 24. In the case of a color display apparatus, a plurality of EL devices of R (red), G (green), and B (blue) containing different organic compound layers is arranged so that adjacent pixels include organic layers 23a and 23b, respectively, constituting light-emitting devices of different colors.

A current supplied to the organic EL device 20 flows between the first electrode 22 (lower layer) and the second electrode 24 (upper layer). The first electrode 22 is provided at each pixel, and the second electrode 24 is disposed in common to the respective pixels. Between the adjacent pixels, a device separation layer 26 for preventing leakage of current from a pixel to an adjacent pixel is disposed. As described above, the second electrode 24 is an electrode common to all the pixels and covers the organic EL layer over the entire display area. In the case where the display apparatus is a top emission-type organic EL display apparatus from which light is emitted upward, the second electrode is a transparent electrode. The first electrode 22 is disposed on an insulating film 28 so as to be electrically isolated from the pixel circuit 19. The insulating film 28 is formed of an organic resinous material in order to keep its upper surface at which the first electrode 22 is disposed in a flat state. Hereinafter, the insulating film 28 is also referred to as a flattening film (layer).

In FIG. 1, as the drive circuit 19, a cross section of a drive TFT including a semiconductor layer 11, a gate electrode 12, a source electrode 13, a drain electrode 14, and an insulating film 15 is shown. The drain electrode 14 of the drive TFT is connected to the first electrode 22 of the organic EL device 20. The drive TFT also includes a switching TFT and a capacitor which are not shown in FIG. 1 but are shown in FIG. 2.

To the drive circuit 19, power is supplied through a plurality of power lines 16 disposed in a row direction or column direction in a display area. A drive current for the organic EL device 20 is supplied from the power line 16 to the organic EL layer 23 via the drive TFT of the drive circuit 19 and to the first electrode 22 and then flows into the second electrode 24. The current flows in an opposite direction depending on a layer structure of the organic EL layer 23. In this case, in FIG. 2, a transistor M1 is an NMOS transistor, a cathode and an anode of the EL device are changed to each other, and a power line VCC and a grounding line GND are also changed to each other.

In order to block the moisture permeation from external (ambient) air, the entire exposed surface of the second electrode 24 is covered with a protection layer (passivation film) 25.

In the following embodiments, the organic EL device will be described as an example. However, the present invention is also applicable to any current drive-type light-emitting device so long as it has such a structure that, in place of the organic EL layer 23, a layer of light-emitting material such as inorganic EL material or LED is sandwiched between a pair of upper and lower electrodes.

First Embodiment

Figure 3:
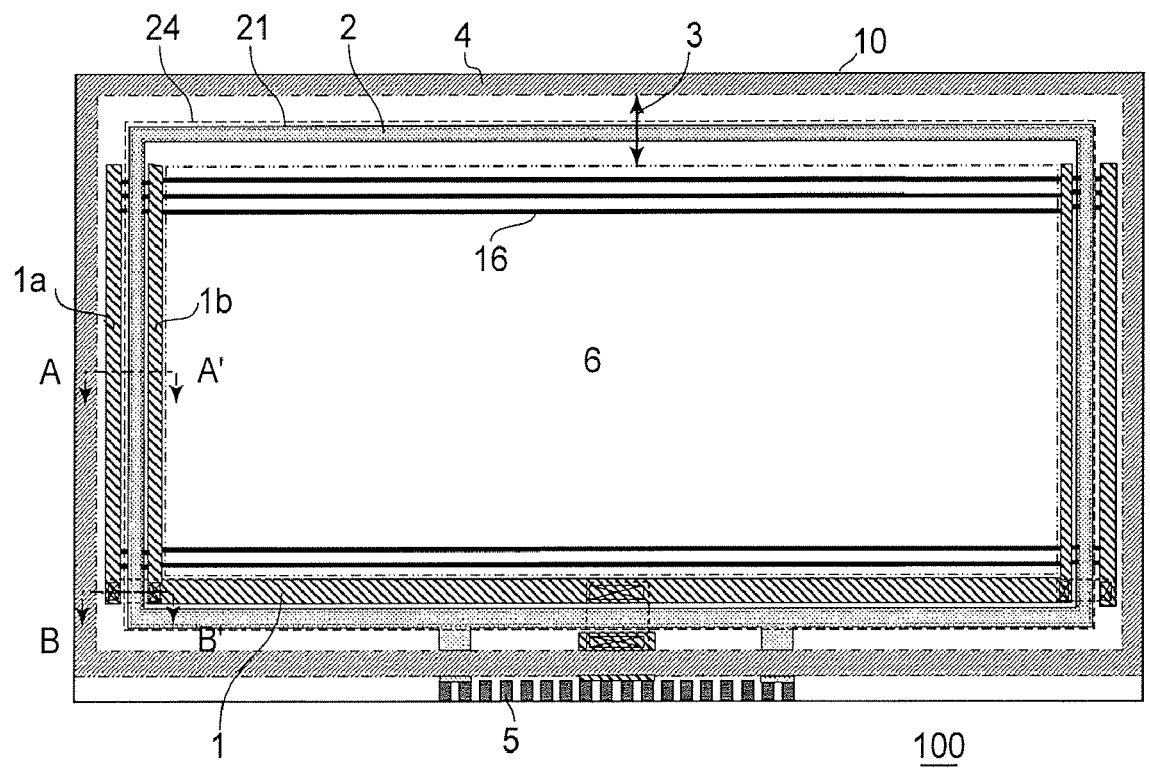
FIG. 3 is a schematic plan view of a display apparatus according to First Embodiment of the present invention.

FIG. 3 is a schematic plan view of an organic EL display apparatus according to First Embodiment of the present invention.

Referring to FIG. 3, a display apparatus 100 includes a single substrate 10 having a substrate surface divided into a display area 6 (an area inside an inner dash-double-dot line) and a peripheral area (an area between the inner dash-double-dot line and an outer dash-double-dot line). In order to block an organic EL device from contact with external air, in the case where the substrate surface is covered with a cap formed of glass or metal, an adhesion area 4 for causing the cap to adhere to the substrate surface is disposed outside the peripheral area 3.

The display area 6 is an area in which the organic EL device 20 and the drive circuit 19, which are shown in FIG. 1, are arranged in a matrix. In this embodiment, the power lines 16 are disposed in a row direction and are parallel to gate signal lines. It is also possible to dispose the power lines 16 in a column direction and in parallel to the signal lines.

In the peripheral area 3, peripheral circuits (not shown) such as a column control circuit, a column shift register, and a row shift register are disposed. These circuits are formed by the same process as the drive circuit 19, thus being formed with the semiconductor layer 11 and other layers similarly as in the case of TFT of the drive circuit 19.

An image signal, a control signal, power and the like are supplied from the outside via external (connection) terminals 5. In FIG. 3, the external terminals 5 are disposed on a lower edge portion, but may also be disposed on right and left edge portions. In the peripheral area 3, two power wiring systems including a first power line 1 for effecting power supply to the pixel circuit (hereinafter referred to as a "power supply line") and a second power line 21 for effecting power supply to the pixel circuit (hereinafter referred to a "common voltage line") are disposed.

The power supply line 1 and the common voltage line 21 are disposed along the periphery of the display area 6 and terminate at corresponding external terminals 5, respectively.

To the power supply line 1, the power lines 16 are connected together and the power supply line is connected to one or two or more external terminals 5. The power supply line 1 is kept at a certain voltage supplied from an external power source (not shown) through the external terminals 5. The common voltage line 21 is an interconnecting line for guiding the second electrode 24 of the organic EL device 20 to the external terminals 5.

Figure 4:
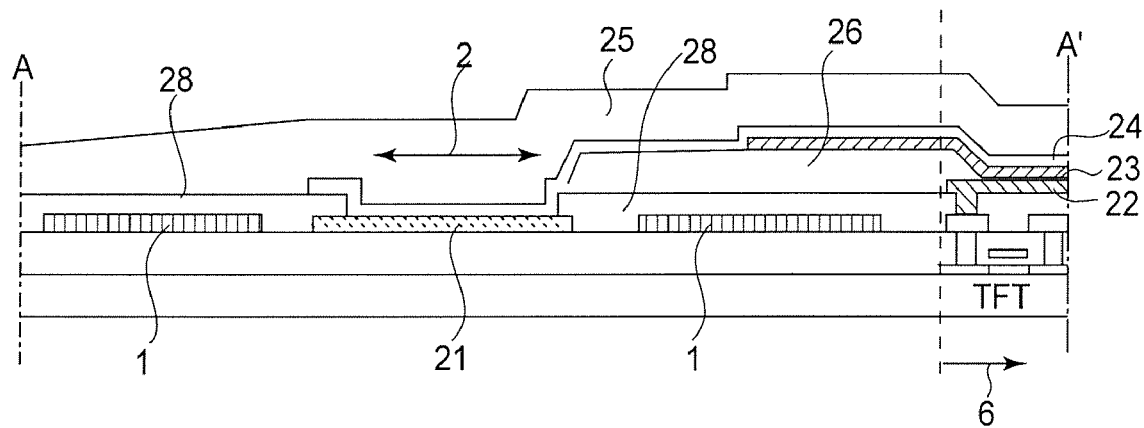
FIG. 4 is a schematic sectional view of the display apparatus taken along A-A' line shown in FIG. 3.
Figure 5:
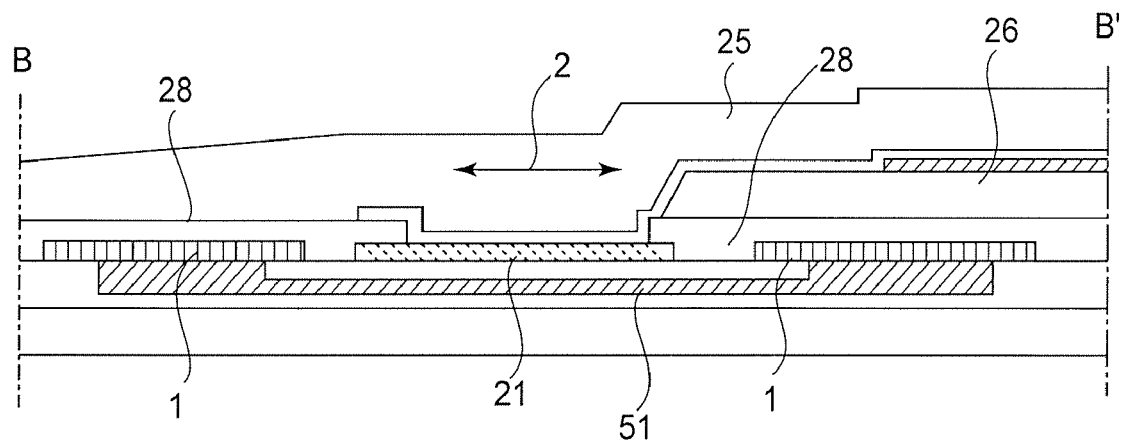
FIG. 5 is a schematic sectional view of the display apparatus taken along B-B' line shown in FIG. 3.

FIG. 4 shows a cross section taken along A-A' line shown in FIG. 3, and FIG. 5 shows a cross section taken along B-B' line shown in FIG. 3.

Both of the power supply line 1 and the common voltage line 21 are formed of the same metal material as that of the source/drain electrodes 13 and 14 of the pixel circuit 19 in order to reduce electric resistance. In the step of film formation and patterning of the source/drain electrodes 13 and 14, the power supply line 1 and the common voltage line 21 are also formed simultaneously.

In this embodiment, the power lines 16 can be formed by the same process as that of gate metal, so that the power lines 16 and the power supply lines 1a and 1b are connected with a structure similar to that shown in FIG. 5 at their intersections.

The common voltage line 21 is formed under the second electrode 24 partially via the insulating layer (flattening film) 28, so that the common voltage line 21 is connected to the second electrode 24 through a contact hole 2.

The protection (passivation) film 25 has the same thickness on the contact hole 2 as that of the display area 6 and is gradually thinned in an area outside the contact hole 2 but does not reach the area 4 in which the sealing cap adheres.

The contact hole 2 is an opening which is formed, in a rectangular (frame-like) shape, continuously along four sides of the second electrode 24 extending in the peripheral area 3. The contact hole 2 may also be disposed in a plurality of discrete contact holes but they are arranged with a small spacing to the extent that an isolation effect of the flattening film 28 can be ensured.

Further, in order to decrease the contact resistance between the second electrode 24 and the common voltage line 21, an area of the contact hole 2 is increased as large as possible. For this purpose, the contact hole 2 may preferably be formed with a full width of the common voltage line 21.

The power supply line 1 is provided in two lines so as to sandwich the common voltage line 21. In FIG. 3, in each of the right and left peripheral areas 3, two power supply lines 1a and 1b are disposed with the common voltage line 21 interposed therebetween. It is also possible to divide the power supply line 1 into two lines between which the common voltage line 21 at the lower side where the external terminals 5 are disposed. Further, the division of the power supply line 1 may also be effected at the upper side opposite to the lower side or at all the four sides.

The thus divided power supply lines 1 (1a, 1b) are connected via a lower electroconductive layer 51 as shown in FIG. 5. The power lines 16 are also connected to the power supply lines 1a and 1b with the same structure. The lower electroconductive layer 51 may preferably be formed together with the gate metal layer 12.

The contact hole 2 also has the function of blocking the moisture permeation path in a planar direction through the flattening film 28 by dividing the flattening film 28 into a plurality of sections. More specifically, the flattening film 28 is separated into a display area-side portion (inner portion) and a substrate edge-side portion (outer portion), whereby the moisture permeating through the flattening film 28 cannot enter the display area, so that the moisture permeation can be blocked at the contact hole portion.

As described above, the contact hole 2 is required to be disposed a certain distance from the end of the substrate or the inner edge of the adhesion area 4 in order to ensure the thickness of the protection film. In addition, the contact hole 2 is also required to be disposed a certain distance from the outer edge of the display area 6 in order to ensure a margin for the positional shift of the organic EL layer in the display area.

In this embodiment, the power supply line 1 is provided in two lines at least in a part of the peripheral area 3 so that one line is disposed between the outer edge of the display area 6 and the inner edge of the common voltage line 2 and the other line is disposed between the outer edge of the common voltage line 21 and the inner edge of the sealing cap adhesion area 4. The other line may also overlap with the area in which the thickness of the protection film 25 is gradually decreased. Incidentally, when the cap sealing is not effected, the inner edge of the adhesion area can be replaced with the end of the substrate.

By disposing the two power supply lines 1 at both sides of the common voltage line 21, it is possible to increase the width of the power supply lines 1 as a whole. For this reason, a wiring resistance of the power supply lines 1 is decreased, thus resulting in less voltage drop even when a large current passes through the power supply lines.

Assuming that a necessary minimum wiring width of the common voltage line 21 is taken as A and that of the power supply lines 1 is taken as B, when the area of the contact hole 2 is increased as large as possible, the resultant width of the contact hole 2 is substantially equal to the width A. In this case, the necessary distance margin outside the contact hole 2 is taken as M1 and that inside the contact hole 2 is taken as M2.

When the power supply line 1 is disposed only inside the common voltage line 21 as in the conventional EL device, a width of B is required in an area inside the contact hole 2. When the width in the area inside the contact hole 2 is larger than M2, the entire frame width is A+B+M1. On the other hand, when the power supply line 1 is disposed only outside the common voltage line 21, the entire frame width is A+B+M2.

In this embodiment, when the power supply line 1 is divided into two lines having a width b1 and a width b2 (b1+b2=B) so that b1 and b2 are smaller than M1 and M2, respectively, the entire frame width is A+M1+M2, which is smaller than that in the case of the conventional EL device.

Thus, the division of the power supply line 1 into two lines is also effective in reducing the frame area.

Second Embodiment

Figure 6:
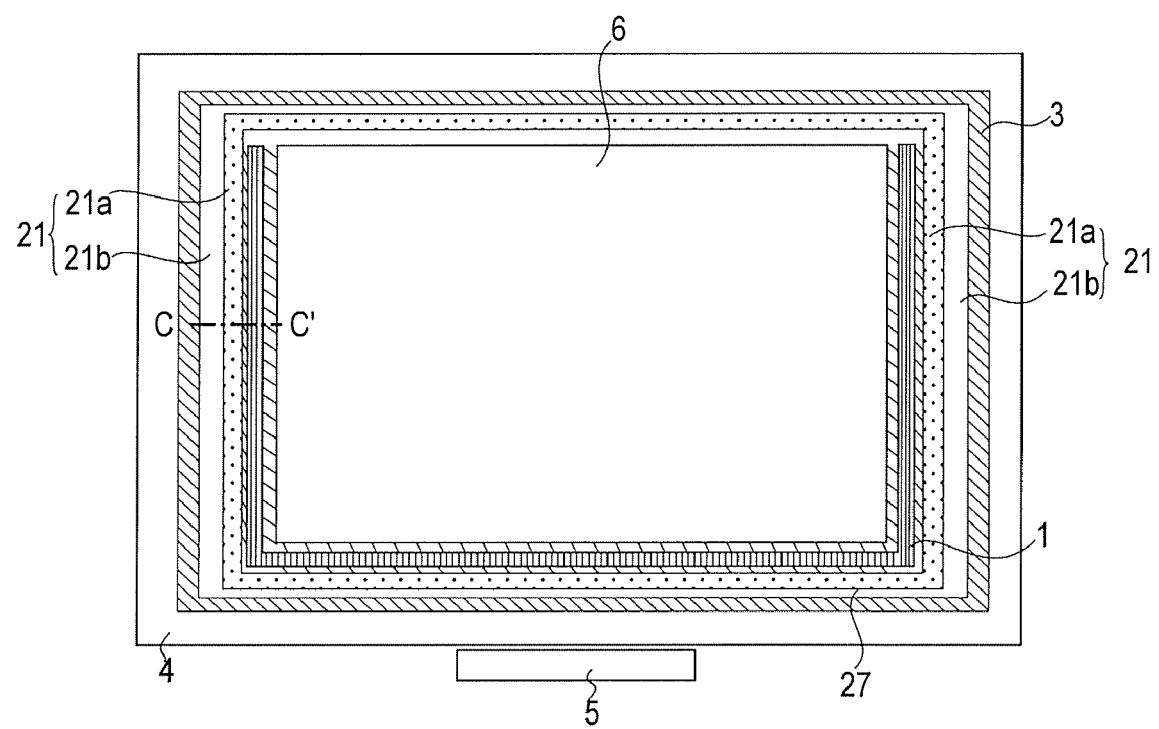
FIG. 6 is a schematic plan view of a display apparatus according to Second Embodiment of the present invention.

FIG. 6 is a schematic plan view showing a display apparatus according to a Second Embodiment of the present invention, wherein members or portions identical to those in the First Embodiment are represented by reference numerals identical to those in First Embodiment and wherein the EL device and the drive circuit in the display area are identical to those in First Embodiment.

Figure 7:
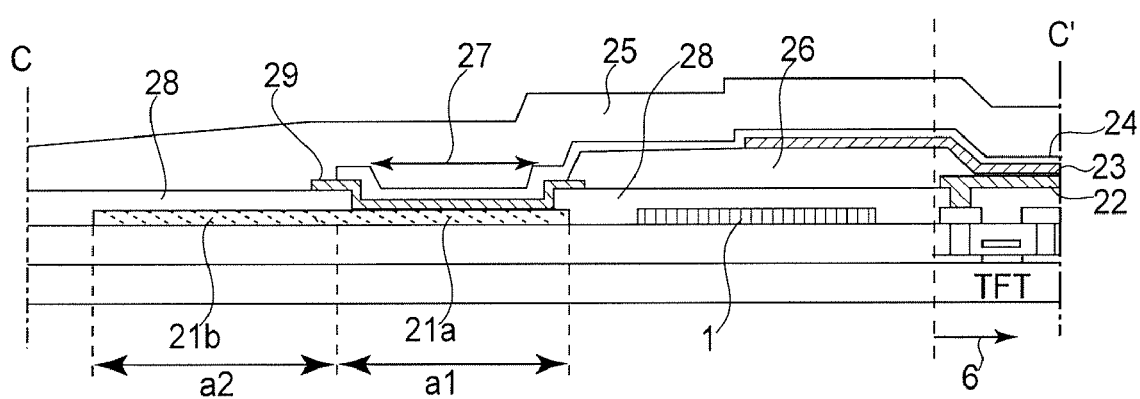
FIG. 7 is a schematic sectional view of the display apparatus taken along C-C' line shown in FIG. 6.

A cross section taken along C-C' line in FIG. 6 is shown in FIG. 7.

In the First Embodiment, the power supply line 1 is divided into two lines but is a single line in this embodiment. The single power supply line 1 is disposed inside the common voltage line 21, i.e., on a side close to the display area 6, in parallel to the common voltage line 21.

The second electrode 24 and the common voltage line 21 do not directly contact each other but are oppositely disposed with another metal layer 29 as an interposed layer. This is because the contact resistance between the second electrode 24 and the common voltage line 22 is decreased.

When the original contact resistance is small, the metal layer 29 is not always required. As shown in FIG. 7, the metal layer 29 may preferably be formed at the same surface, with the same material, and in the same step as those in the case of the first electrode 22.

As described in First Embodiment, from the outer edge of the contact hole 2 to the adhesion area 4, a distance of a certain value or more is required.

By providing the metal layer 29, the contact resistance is lowered, so that the width of a contact hole 27 can be narrower than the width of the common voltage line 21. In this case, the common voltage line 21 is disposed in such a manner that it is extended to a side opposite from the side of the power supply line 1, i.e., outside the contact hole 27, with a width larger than that of the contact hole 27 as shown in FIG. 7. More specifically, in this embodiment, the second power wiring is constituted by two portions including a common voltage line 21$a$ contacting the second electrode 24 via the metal layer 29 in the contact hole 27 and a common voltage line 21$b$ extended from the contact hole 27. In this embodiment, the width of the contact hole 27 is decreased, so that the width of common voltage line 21$a$ is also decreased. The total width of the common voltage line 21$a$ and the common voltage line 21$b$ is kept at a value identical to the width of common voltage line 21 in the First Embodiment so as not to increase the wiring resistance.

When the width of the common voltage line 21$a$ is taken as a1 and that of the contact hole 27 is taken as $\underline{a}$, a1 is equal to $\underline{a}$. Further, the width of the common voltage line 21$b$ is denoted as a2 and the minimum wiring width of the power supply line 1 is denoted as B, and the margins on both sides of the contact hole 27 are denoted as M1 and M2. Further, a1+a2=A.

In this embodiment, the power supply line 1 is disposed inside the contact hole 27, so that the width of B is required in an area inside the contact hole 27 and outside the display area 6, which is larger than the minimum margin M2. On the other hand, in an area outside the contact hole 27, when the width a2 of the common voltage line 21$b$ can be absorbed by the margin M1 in an area outside the contact hole 27 and inside the adhesion area, i.e., when a2<M1 is satisfied, the necessary width outside the contact hole 27 is M1.

Accordingly, the entire frame width in this embodiment is a+B+M1, which is smaller than the conventional entire frame width of A+B+M1.

When a2>M1 is satisfied and the width a2 of the common voltage line 21$b$ cannot be absorbed by the margin M1, the necessary width outside the contact hole 27 is a2. As a result, the entire frame width in this case is a1+a2+B, i.e., A+B, which is also smaller than the conventional entire frame width.

As described above, when the contact hole width a can be smaller than the common voltage line width A as in this embodiment, it is possible to decrease the entire frame width by extending the common voltage line toward the outside of the contact hole 27.

When the above described entire frame width a+B+M1 or A+B is compared with the entire frame width A+M1+M2 in the First Embodiment, the frame width in this embodiment is smaller than that in the First Embodiment on condition that the common voltage line width A can be absorbed by the margin M1 and a2>B−M2 is satisfied. In other words, when the contact hole width a is sufficiently smaller than the common voltage line width A and an increase in width of the power supply line 1 due to the single power supply line can be absorbed, the entire frame width is smaller than that in the First Embodiment.

In this embodiment, it is also possible to dispose the power supply line 1 outside the contact hole 27 and extend the common voltage line 21 toward the inside of the contact hole 27. In this case, the resultant entire frame width is not changed in the above described case in this embodiment since the margins M1 and M2 are only changed to each other.

At a lower side when the external terminal 5 is disposed, a large current flows in the power supply line 1, so that the width B of the power supply line 1 is required to be larger than those at the right and left sides. In such a case, the above described condition: a2>B−M2 is not satisfied, the resultant entire frame width is rather increased when the constitution of the Second Embodiment is adopted. For this reason, in such a case, the constitutions of the First and Second Embodiments can be selectively and effectively used depending on the sides of the substrate in such a manner that the constitution of the Second Embodiment is employed on the right and left sides and the constitution of the First Embodiment is employed on the lower side.

As described in the First and Second Embodiments of the present invention, either one of power interconnecting lines consisting of the power supply line and the common voltage line is disposed on both sides of the contact hole for blocking the moisture permeation path by surrounding the display area. As a result, it is possible to ensure a larger power wiring width, so that the voltage drop of the power wiring can be prevented. Further, it is also possible to decrease the peripheral portion of the display area, i.e., the frame width.

(Pixel Circuit)

A common pixel circuit to the First and Second Embodiments will be described with reference to FIG. 2 showing the EL device and the drive circuit thereof.

Referring to FIG. 2, a source of a drive transistor M1 is connected to a power line VCC, a gate thereof is connected to a capacitor C1 and a source of a transistor M2, and a drain thereof is connected to an EL device EL via a transistor M4.

Control lines P1 and P2 switch a pixel circuit between a programming operation and a light-emitting operation so as to turn the respective transistors M2 to M4 on and off. More specifically, in the programming operation, the transistors M2 and M3 are turned on and the transistor M4 is turned off, whereby a current value is written in the capacitor C1. Current data I (data) flows into the transistor M1, in which the gate and the drain are short-circuited, via a data signal line and the transistor M3. As a result, a current value is written in the capacitor C1. In the light-emitting period, the transistors M2 and M3 are turned off and the transistor M4 is turned on. The current written in the capacitor C1 flows into the EL device EL via the transistor M1 to the transistor M4. Depending on the value of current flowing into the EL device EL, the EL device EL emits light.

Incidentally, the control method of light emission of the EL device may also include a voltage-setting method in addition to the current-setting method as shown in FIG. 2. The present invention is applicable to both of these setting methods.

The above described display apparatuses in the First and Second Embodiments are top emission-type EL display apparatuses but the present invention is also applicable to an EL display apparatus of a bottom emission-type wherein light is emitted from a transparent substrate side where a pixel circuit is formed. In this case, a transparent electrode is used as the pixel electrode constituting a first electrode (lower layer) formed on a substrate. A second electrode (upper layer) may also be a transparent electrode. However, in the case of using reflected light, an electrode formed of metal material such as aluminum is used.

In the above description, the display apparatus using the EL device is described as an example but the present invention is not limited thereto. For example, the present invention is also applicable to a current drive-type display apparatus such as a plasma panel display (PDP) or a field emission display (FED).

Hereinbelow, a digital still camera system as a suitable embodiment of the present invention in which the display apparatus described in First Embodiment or Second Embodiment is used will be described.

Figure 8:
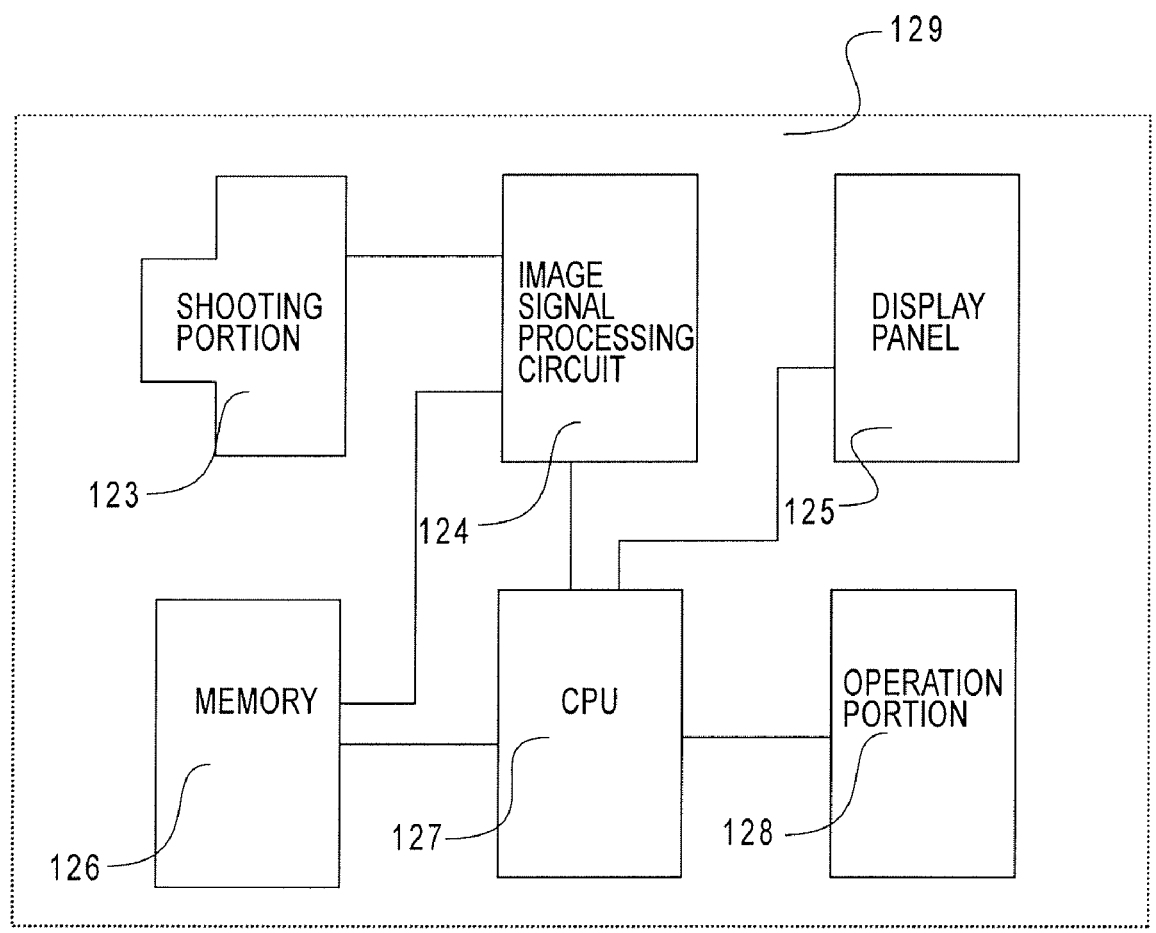
FIG. 8 is a block diagram showing an embodiment of a digital still camera.

FIG. 8 is a block diagram of an example of the digital still camera system. Referring to FIG. 8, a digital still camera system includes an image shooting portion 123, an image signal processing circuit 124, a display panel 125, a memory 126, a CPU 127, and an operation portion 128. An image which is shot by the shooting portion 123 or stored in the memory 126 is signal-processed by the image signal processing circuit 124, and is viewable by the display panel 125. The CPU 127 controls the shooting portion 123, the memory 126, the image signal processing circuit 125, and the like based on an input from the operation portion 128, thus effecting shooting, recording, reproduction, or display depending on situation. Further, the display panel 125 may also be utilized as a display portion of various electronic equipments.

While the invention has been described with reference to the structures disclosed herein, it is not confined to the details set forth and this application is intended to cover such modifications or changes as may come within the purpose of the improvements or the scope of the following claims.

This application claims priority from Japanese Patent Application No. 331602/2005 filed Nov. 16, 2005 which is hereby incorporated by reference.

What is claimed is:

1. A current drive type display apparatus, comprising:

a display area in which are disposed on a substrate a plurality of current drive type light emitting devices and a plurality of pixel circuits that control a drive current for the current drive type light emitting devices; and a peripheral area, on the substrate, in which are disposed first and second interconnecting lines that supply current to the pixel circuits;

wherein each of the current drive type light emitting devices includes a first electrode as a lower layer, a second electrode as an upper layer, and a plurality of layers of an organic compound disposed between the first and second electrodes, wherein each pixel circuit is connected to the first interconnecting line and supplies the drive current to an associated current drive type light emitting device through the first electrode, wherein the second electrode is connected, through a contact hole provided in said peripheral area, to the second interconnecting line which is in a layer of said apparatus that is lower than the second electrode, wherein at least said display area and the contact hole are covered with a passivation layer; and wherein at least along one side of the substrate in said peripheral area, the second interconnecting line is disposed immediately under the contact hole and the first interconnecting line is disposed between the second interconnecting line and one edge of the substrate and between the second interconnecting line and said display area.

* * * * *